(12) United States Patent
Fink et al.

(10) Patent No.: US 7,960,718 B2
(45) Date of Patent: Jun. 14, 2011

(54) PRINTABLE THIN-FILM TRANSISTOR FOR FLEXIBLE ELECTRONICS

(75) Inventors: Richard Lee Fink, Austin, TX (US); Zvi Yaniv, Austin, TX (US)

(73) Assignee: Applied Nanotech Holdings, Inc., Austin, TX (US)

( * ) Notice: Subject to any disclaimer, the term of this patent is extended or adjusted under 35 U.S.C. 154(b) by 591 days.

(21) Appl. No.: 11/772,711

(22) Filed: Jul. 2, 2007

(65) Prior Publication Data

US 2008/0173865 A1     Jul. 24, 2008

Related U.S. Application Data

(60) Provisional application No. 60/819,574, filed on Jul. 10, 2006.

(51) Int. Cl.
*H01L 29/08* (2006.01)
(52) U.S. Cl. ..... 257/40; 257/39; 257/642; 257/E39.007; 257/E51.001
(58) Field of Classification Search ............ 257/39, 257/40, 642, E39.007, E51.001
See application file for complete search history.

(56) References Cited

U.S. PATENT DOCUMENTS

| | | | |
|---|---|---|---|
| 2003/0062816 A1* | 4/2003 | Terada et al. | 313/310 |
| 2006/0006377 A1* | 1/2006 | Golovchenko et al. | 257/39 |
| 2006/0027860 A1* | 2/2006 | Nomoto | 257/327 |
| 2006/0086976 A1* | 4/2006 | Mardilovich et al. | 257/347 |

OTHER PUBLICATIONS

Nagahara et al, "Directed placement of suspended carbon nanotubes for nanometer-scale assembly" American Institute of Physics magazine, May 2002, vol. 80, No. 20, 3 pages.
Li et al. "Friction transfer deposition of ordered conjugated polymer nanowires and transistor fabrication" American Institute of Physics magazine, Aug. 2005, vol. 87, No. 6, 3 pages.
International Search Report and Written Opinion for PCT/IB2007/003071 mailed Apr. 3, 2008, 14 pages.

* cited by examiner

*Primary Examiner* — Jerome Jackson, Jr.
*Assistant Examiner* — Dale Page
(74) *Attorney, Agent, or Firm* — Kelly Kordzik; Matheson Keys Garsson & Kordzik PLLC

(57) ABSTRACT

Fabrication of thin-film transistor devices on polymer substrate films that is low-temperature and fully compatible with polymer substrate materials. The process produces micron-sized gate length structures that can be fabricated using inkjet and other standard printing techniques. The process is based on microcrack technology developed for surface conduction emitter configurations for field emission devices.

12 Claims, 8 Drawing Sheets

PRINTABLE THIN-FILM TRANSISTOR FOR FLEXIBLE ELECTRONICS

This application for patent claims priority to U.S. Provisional Patent Application Ser. No. 60/819,574.

BACKGROUND

Most commercially available flat panel displays are currently made on glass substrates. Glass substrates offer many advantages in manufacturing displays since they are compatible with many process technologies. From a user perspective, glass substrates have many disadvantages: they are heavy, rigid, prone to breakage from mechanical shock, and difficult to conform to forms that are not flat. By using flexible substrates instead of sheet glass, these issues are significantly reduced or eliminated completely. For this reason, flexible displays and electronics (RFID tags, etc.) are highly desired for military applications where user environments are harsh and reducing power and weight and improving ruggedness are desired characteristics.

There is a large commercial industry already established based on liquid crystal display (LCD) technology. This display architecture is not desirable for portable military applications; LCDs generally require a backlight, and the use of color filters to generate color significantly reduces the power efficiency. Standard cold-cathode fluorescent lamp (CCFL) edge light backlight technology is counter to the flexible display concept, although new LED edge lighting may improve the situation. Flexible reflective or emissive displays such as organic LED (OLED) technologies are preferred. Unfortunately, even these display technologies require an active circuit backplane in order to achieve the necessary uniformity, lifetime, brightness and efficiency.

The first attempts at putting active circuits onto flexible substrates were to modify existing processes already developed for glass substrates. Amorphous silicon (a-Si) thin-film transistors (TFTs) are widely used in the active matrix liquid crystal display (AM-LCD) industry. Production of a-Si TFT-LCDs has already exceeded Gen 7 glass substrate sizes (1870×2200 mm). Unfortunately, what works for LCD technology, which is a voltage-driven technology, does not work well for OLED technology, which is a current-driven technology. Although a-Si TFTs work wonderfully for LCDs, the mobility is too low and the stability is too poor for OLED applications. Table 1 shows typical requirements for active circuit elements for both AM-LCD and AM-OLED applications.

TABLE 1

Comparison of active circuit element requirements of LCD and OLED applications.

|  | AM-LCD | AM-OLED |
| --- | --- | --- |
| $I_{OFF}$ (A) | $<2 \times 10^{-13}$ | $<10^{-12}$ |
| $I_{ON}$ (A) | $>2 \times 10^{-7}$ | $>10^{-6}$ |
| $I_{ON}/I_{OFF}$ | $>10^6$ | $>10^6$ |
| $V_{th}$ (V) | $<2$ | $<2$ |
| S (V/dec) | $<0.5$ | $<1.0$ |
| $\tau$ (switching) | N/A | $>200$ ns |

To improve the mobility of the a-Si TFTs, they are subjected to a heat-treatment using a laser beam that anneals the Si layer to form polycrystalline Si. The material from this process is generally referred to as low-temperature poly-Si, or LTPS. LTPS TFTs have higher mobilities but also tend to have larger variations in threshold voltage ($V_{th}$) that result in display non-uniformity (generally referred to as mura). This is especially true when this process is transferred to flexible substrates. Although a-Si transistors have been successfully processed (N. D. Young, et al., "Thin-Film-Transistor and Diode-Addressed AMLCDs on Polymer Substrates," J. SID, Vol. 5-3, pp. 275-281, 1997) directly on plastic substrates, the technology is still in a research phase. Problems with a-Si and LTPS technologies include the difficulty of forming a high-quality layer at temperatures sufficiently low to prevent the plastic substrate from degrading, which results in reduced transistor performance (G. H. Gelinck et al., "Rollable QVGA AM Displays Based on Organic Electronics;" SID '05 Digest, p. 6, 2005), The flexibility and expansion/shrinkage of polymer films as a result of large process temperature swings also introduces problems with mask, alignment in the photolithography process and in the handling of polymer films. High temperature processes shrink the polymer film, often non-uniformly, leading to warping of the film and contribute to misalignment of subsequent layers. Stresses from deposited layers treated at high temperature lead to curling of the film.

There have been several approaches to address these issues. In a first approach, substrate transfer technologies, in which silicon-based transistors are first manufactured on rigid substrates suffered from unreliable contacts (S. Inoue et al., IEEE Trans. Electron Devices, Vol. 49, pp. 1353-60, 2002). In a next approach, carbon nanotube and other semiconducting nanowires and nanoparticles were used by several groups in an attempt to make a nanoparticle-based TFT technology. Early work at the Naval Research Lab (NRL) (E. S. Snow et al., "Random Networks of Carbon Nanotubes as an Electronic Material," APL., 82, p. 2145, 2003) and then followed up by work at Applied Nanotech, Inc. (ANI) (J. P. Novak et al., "Flexible Carbon Nanotube Thin-film Transistors," IDW/AD '05, p. 257, 2005) demonstrated that CNT-based TFT can be deposited using printing techniques. ANI also demonstrated that the mobility of the material and the current through the device in the on-state were sufficient to drive large LCD segmented display pixels and LED devices, but that the on/off current ratio was only $10^4$. To improve this ratio would require an ink containing only semiconducting single-wall nanotubes. Many groups are working on this and if successful can lead to a significant breakthrough for this and other printable microelectronic applications. Rice University has demonstrated significant progress using an electrophoresis technique (Haiqing Peng et al., "Dielectrophoresis Field Flow Fractionation of SWNT," JACS Comm. web Jun. 9, 2006) to create an ink of semiconductor-enriched CNTs. This enriched solution is part of the approach used in the present invention.

Another approach would be nanowires of Si, Ge or other semiconducting compounds. Charles Lieher and the company Nanosys have demonstrated TFTs made of Si nanowires and CdS nanoribbons on a Si substrate and PEEK polymer sheet (X. Duan et al., "High-performance TFTs using Semiconductor Nanowires," Nature, 425, 274, (2003)). These devices demonstrated excellent TFT performance on both Si and polymer substrates ($V_{th}$~3.0V; on/off ratio greater than $10^5$ on polymer substrates; subthreshold swing of 500-800 mV/decade, hole mobilities estimated at 123 cm²/Vsec), The channel length of these devices was 5 μm. Because of the relatively large channel length, these excellent properties were achieved only when the Si nanowires were aligned. Little change in the characteristics were observed when the polymer substrate was bent to a radius of 55 mm, thus demonstrating that there was sufficient adhesion and flexibility of the nanowires to allow flexing of the substrate. Use of Si and GaN nanowires will also be used in the present invention along with Inkjet printing to deposit randomly orientated nanowires and ac-biased electrophoresis to deposit aligned nanowires.

Most importantly, other than the fabrication of the CNT or the semiconducting nanowires, the other process steps were truly low temperature and fully compatible with polymer substrates.

Polymer semiconductors approaches are being investigated by several companies (Polymer Vision. Plastic Logic, etc.) and research centers (Kyung Hee University. University of Michigan, etc.). There is now a wide variety of these materials. Table 2 shows the properties for a few of the more widely-used materials. Pentacene is the most popular of these materials. It can be deposited either by vacuum evaporation through a shadow mask or printed via solution. The properties of the material are much better if deposited through vacuum evaporation. Polymer semiconductors suffer from high threshold field (30V) and low mobility (1 $cm^2$/Vsec, similar to a-Si), but have demonstrated excellent uniformity. Process temperatures are less than 130° C., compatible with polymer substrates. Table 3 summarizes the display prototypes using organic TFTs (I Jang and S. H. Han, "High-Performance OTFTs on Flexible Substrates," SID 06 Digest, p. 10, 2005). E-paper and LCD were made with organic TFTs matrix arrays and AM-OLEDs were made with dot patterns. The AM-OLED suffered from significant brightness non-uniformity, mainly due to the grain size distribution of the polycrystalline organic semiconductors. On the other hand, LCD and E-paper displays need only high on/off current ratio and are generally immune to differences of TFT current in the on state.

TABLE 2

| Organic Semiconductor | Typical TFT Performance |
| --- | --- |
| Pentacene | $\mu = 1$ $cm^2$/Vs |
|  | $I_{on}/I_{off} > 10^6$ |
| Poly(3-hexylthiophene) | $\mu = 0.1$ $cm^2$/Vs |
|  | $I_{on}/I_{off} > 10^4$ |
| Polyfluorene-based polymer | $\mu = 0.1$ $cm^2$/Vs |
|  | $I_{on}/I_{off} = 10^6$ |
| Regioregular poly(thiophene) (XPS) | $\mu = 0.1$ $cm^2$/Vs |
|  | $I_{on}/I_{off} = 10^6$ |

TABLE 3

| Research Organization | Application | Semiconductor | Specification |
| --- | --- | --- | --- |
| Plastic Logic (UK) & E-Ink (USA) | E-Paper | Polyfluorene-based polymer (ink-jet printing) | 60 × 80 pixels on PET |
| Philips (Netherlands) | E-Paper | Pentacene (solution-process) | QVGA on PEN |
| Hitachi (Japan) | LCD | Pentacene | 1.4" 80 × 80 RGB on glass |
| ERSO/ITRI (Taiwan) | LCD | Pentacene | 64 × 128 on plastic |
| Samsung Elec. (Korea) | LCD | Pentacene | 15" Full color XGA on glass |
| NHK (Japan) | OLED | Pentacene | 4 × 4 pixel on PC |
| Pioneer (Japan) | OLED | Pentacene | 8 × 8 pixels on glass |

In summary, for emissive display technologies that can be fabrics led on plastic, such as OLED, TFT devices with high on-current levels that, are uniform from pixel to pixel are required. Although a-Si and LTPS TFT approaches work well for glass substrates, they require process temperatures that are too high for standard polymer substrate materials. This leads to poor TFT performance, warping and curling of the substrate materials and misalignment of patterns from level to level.

For polymer substrates, it would also be a great advantage if the active matrix array could be fabricated using printing techniques, and avoiding photolithography processing as much as possible. Printing can be performed roll-to-roll and over surfaces as large as a billboard. Since printing is an additive process, fabrication costs can be reduced as a result of lower material costs and fewer processing steps.

DETAILED DESCRIPTION

The present invention addresses the foregoing needs with an approach to fabricating TFT devices on polymer substrate, films that is low-temperature and fully compatible with polymer substrate materials. This approach also allows micron-size gate length structures than can be fabricated using inkjet and other standard printing techniques. The approach is based on the microcrack technology developed by Canon in its effort to make Surface Conduction Emitter (SCE) displays (K, Yamamoto et al., "Fabrication and Characterization of SCE Emitters," SID 05 Digest, p. 1933; and T. Oguchi et al., "A 36-inch Surface-Conduction Electron-Emitter Display (SED)," SID 05 Digest, p. 1929). In this process, Canon demonstrated that it could make large arrays of micron-sized cracks in structures that are fabricated using printing techniques. The microcracks are formed by reducing a PdQ layer to Pd metal. During this process, local stresses in the layer force cracks across the layer. The present invention uses these microcracks as the gap between source and drain electrodes. The process is modified to introduce a gate electrode to the structure. Any one of the low-temperature semiconductor approaches described earlier (carbon nanotubes, semiconducting nanowires or organic semiconductors) may be used as the active semiconducting layer in this self-formed microcrack TFT approach since they can be deposited at low temperature using printing or solution-based techniques. A description of this approach follows.

Figure 1:
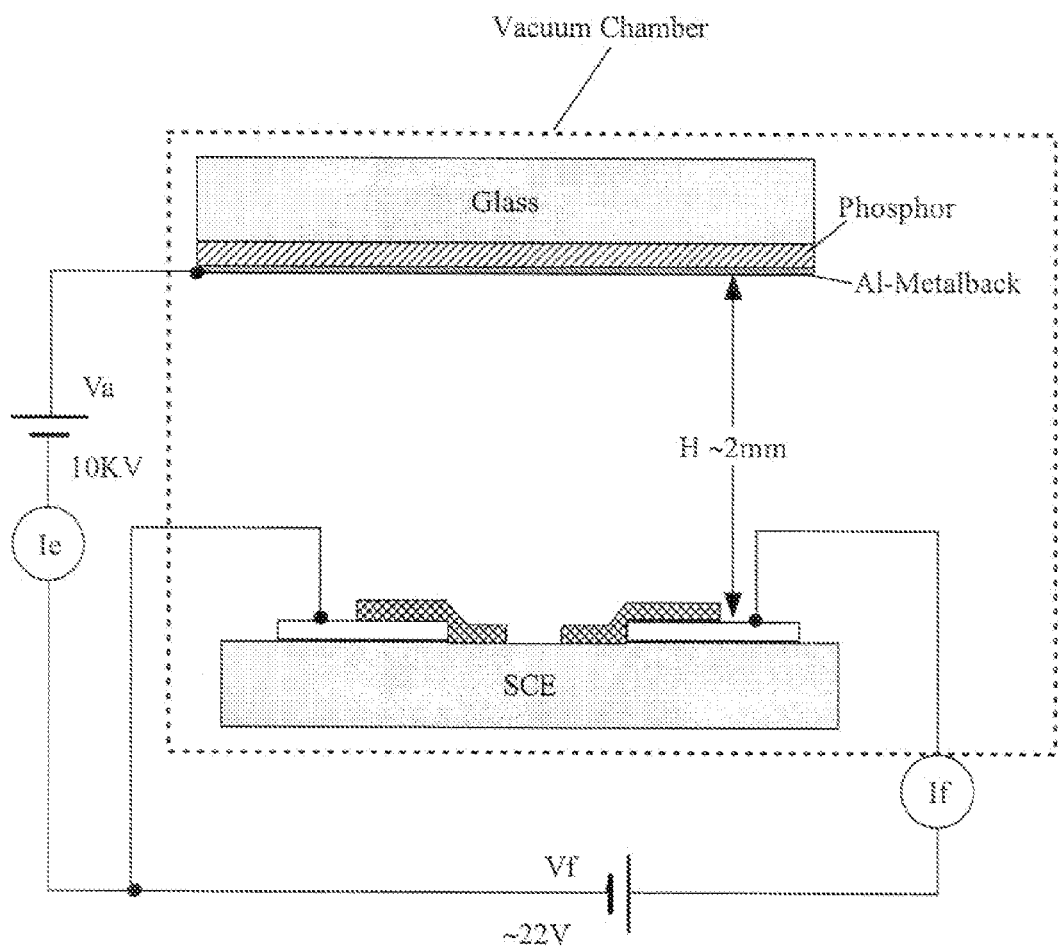
FIG. 1 illustrates a surface conduction emitter configuration in a field emission mode.

Description of Canon SCE Microcrack Process Compared to TFT Process of the Present Invention Canon developed the Surface Conduction Emitter (SCE) technology for a field emission display application. Most field emission structures are vertical, with cathode, gate, focus and anode electrodes in a linear stack. The Canon SCE approach changes the cathode and gate structure from vertical to a horizontal structure, formed on a glass substrate. FIG. 1 illustrates the configuration for field emission applications. The microcrack is located between the two electrodes shown in FIG. 1 above the letters SCE. Free electrons generated at the microcrack are accelerated to the anode.

In this field emission approach, a microcrack is formed between two electrodes. When sufficient voltage is applied between the two electrodes on either side of the crack, electrons are extracted from one side and attracted to the other side of the gap. Most of the electrons that jump across the crack are absorbed by the other electrode, but some (about 3%) escape and are accelerated to the anode which has a 10 kV potential applied to it. The anode is coated with phosphor material, such that when the electrons strike the phosphor, light is emitted.

Figure 2A:
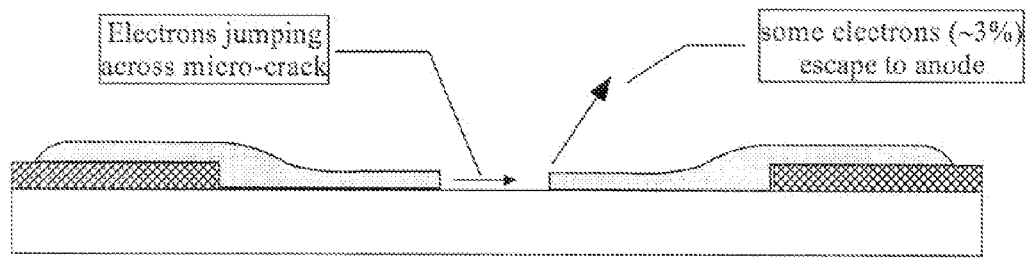
FIG. 2A illustrates a microcrack structure used for an electron field emission application.
Figure 2B:
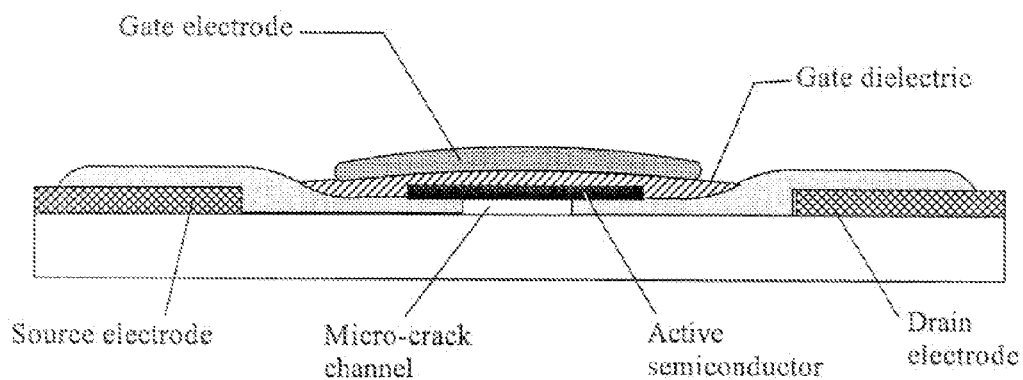
FIG. 2E illustrates a microcrack structure used for a TFT application with a top-gate configuration.

The present invention uses the microcrack structure used as a field emission device in SCE as part of a TFT structure for emissive OLED or other display technologies on polymer substrates. The microcrack that is formed (described below) is less than a micron wide. It will form the channel between source and drain of the TFT. FIGS. 2A and 2B illustrate the similarities and differences between the structure used for field emission and a similar structure used for TFT applications.

FIG. 2A is an illustration of a microcrack structure used for an electron field emission application. FIG. 2B is an illustration of a microcrack structure used for a TFT application with a top-gate configuration.

Figure 4:
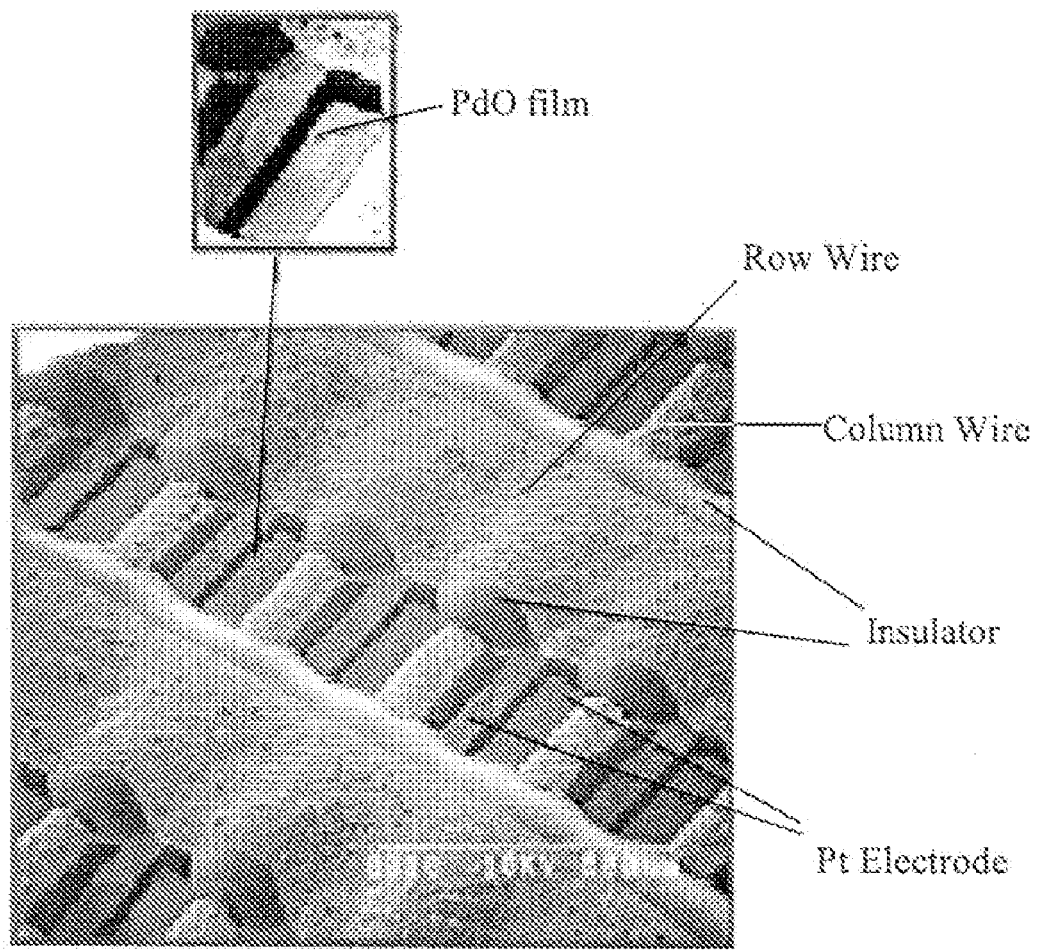
FIG. 4 illustrates an SEM image of a SCE field emission cathode structure.

The process steps that Canon uses to form the microcracks are described below. FIG. 4 is an SEM image of a Canon SCE cathode thai will be used to illustrate how the layers are assembled.

Figure 3A:
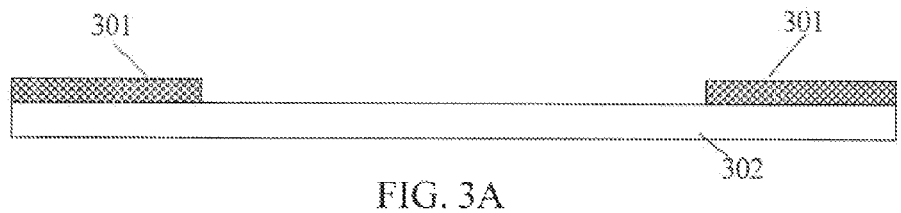
FIGS. 3A-3E illustrate a step-by-step process for manufacturing an embodiment of the present invention.

Referring to FIG. 3A, first, Pt electrodes 301 are patterned onto the glass substrates 302 using thin film evaporation and photolithography. The Pt electrodes 301 are patterned in pairs. For the TFT structure, one half of the pair will be the source and the other half will be the drain Ag electrode may replace Pt, Furthermore, these electrodes 301 may be printed instead of using thin films and photolithography.

For the display, the next step is to connect the Pt electrodes 301 to row and column wires using screen printing or inkjet printing techniques. Insulating layers are also deposited to prevent the wires from shorting to each other. In the case of the TFT, one of the wires is connected to the source and the other connected to the gate, depending on the drive voltages and configuration needed. The drain is connected to a common ground line. FIG. 4 identifies these elements for the Canon SED; they are similar for the TFT configuration as well. The matrix feedline structure is not critical to demonstrating the feasibility of the approach to the TFT and may be optional.

Figure 3B:
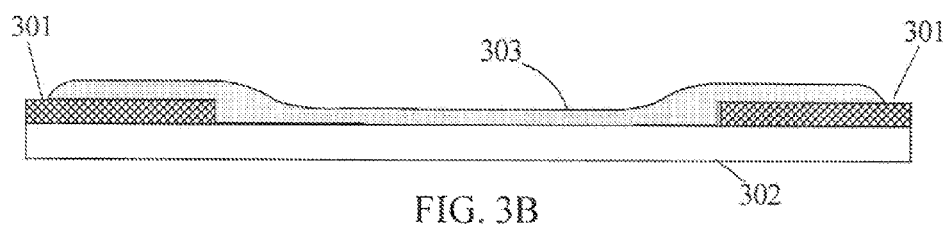
Figure 5:
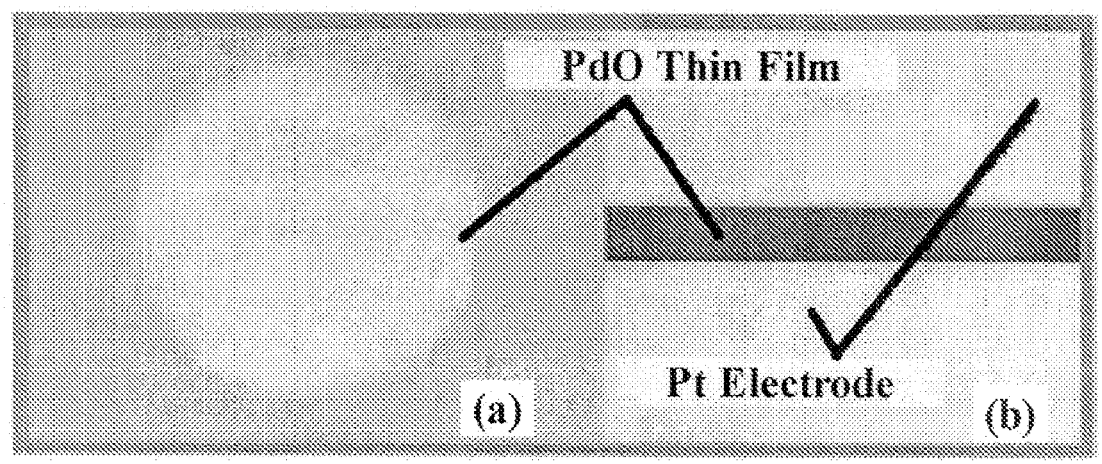
FIG. 5 illustrates an image of a PdO layer on a bare substrate.

Next, referring to FIG. 3B, a layer of PdO is deposited onto the source-drain electrode pair 301 and in the gap between the pair. The PdO film in the Canon SED device is shown in the insert in FIG. 4 and in higher magnification in FIG. 5. FIG. 5(a) is an image of a PdO layer on a bare substrate. FIG. (b) is an image of a PdO layer on the Pt electrodes and gap between the electrodes. The PdO layer in the TFT device may be about 0.1 μm thick or less.

Figure 3C:
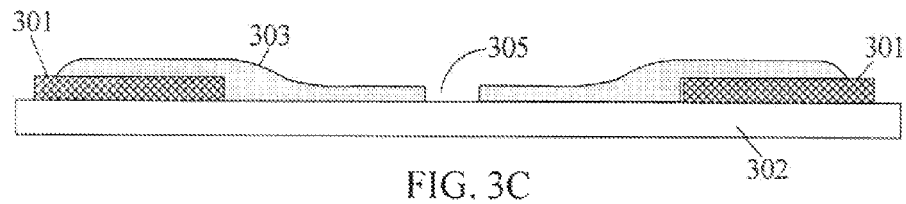

Next, Referring to FIG. 3C, the PdO layer 303 is reduced by placing the substrate in a reducing environment such as a partial pressure of hydrogen and an inert gas such as nitrogen or argon. While in this environment a voltage is pulsed between the Pt electrodes 301, forcing a current across the gap. At first this current is small, but as the PdO begins to reduce to Pd metal, the current increases. Eventually, as the PdO continues to reduce, a microcrack 305 is formed across the gap for the lull width of the PdO film 303.

Canon has developed a method of further reducing the microcrack to nanometer dimensions by depositing a layer of carbon in the crack 305 and thus reducing the driving voltages for the SCE field emission display. In one embodiment of the present invention, the microcrack forming process will not be extended beyond the microcrack 305. Making the microcrack smaller by using the carbon deposition process described by Canon (e.g., U.S. Pat. No. 6,992,434) may not benefit the TFT and may not be compatible with the polymer substrates.

Figure 3D:
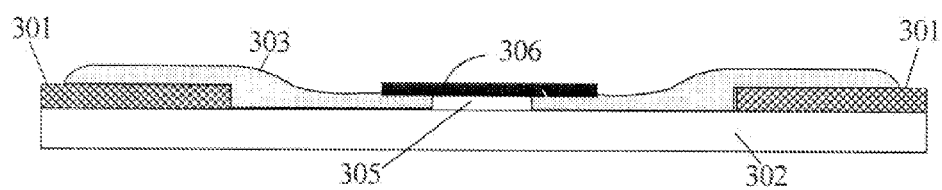
Figure 3E:
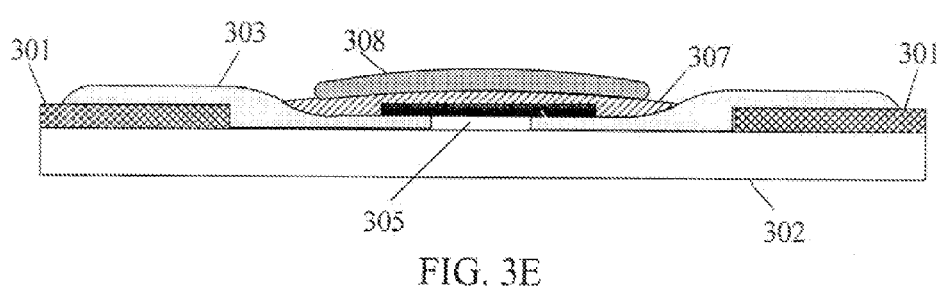

No more processing is needed for the SED, but for the TFT application, the process is continued by applying the active semiconductor (FIG. 3D) and completing the gate structure (FIG. 3E).

Referring to FIG. 3D, three of the low-temperature semiconductor solutions mentioned earlier (semiconducting carbon nanotubes, semiconducting nanowires or organic semiconductors such as pentacene) 306 may be applied to the microcrack 305 to form the TFT. Semiconducting nanowires or semiconductor-enriched carbon nanotubes are possible embodiments. Semiconducting nanowires have shown excellent performance in TFTs on polymer substrates using a different approach; similar results are expected with this approach. It is a low temperature process and may be dispensed using printing approaches. Si, GaN and other semiconducting nanowire materials are being developed by several research groups, including the University of Louisville (M. K. Sunkara et ah, "Bulk Synthesis of Si Nanowires Using Low-Temperature VLS Method," APL, 79, p. 1546, 2001; H. Li et al., "Direction-Dependent Homoepitaxial Growth of GaN Nanowires," Adv. Mater., 18, p. 216, 2006). Also used may be semiconductor-enriched CNTs from Rice University. (Haiqing Peng et al., "Dielectrophoresis Field Flow Fractionation of SWNT," JACS Comm. web Jun. 9, 2006.) CNTs are flexible, adhere well to surfaces and make good ohmic contacts.

Pentacene may also be used, but the switching voltage of this material is large (30V), and optimal mobility of tins material is achieved only when the material is grown on the substrate using CVD or evaporation processes. Printing this material has been demonstrated but yielding lower mobility, as much as a factor of 10× lower. Pentacene and other organic semiconductors are also very susceptible to attack by humidity and oxygen and are thus much more difficult to work with.

Referring to FIG. 3E, the gate dielectric 307 and gate electrode 308 are deposited. Embodiments of the present invention produce a thin-film transistor suitable for emissive OLED technology that is printable, requires process temperatures below 200° C. and is fully compatible with plastic substrates such as polyethylene naphthalate (PEN), polyethylene terephthalate (PET), or equivalent.

The microcrack structure originally developed as a field emission device for Surface Conduction Emitters by Canon is used as part of a TFT structure for emissive OLED or other active circuit requirements on polymer substrates. An advantage of this approach is that the technical objectives can be achieved using low-temperature printing to create the devices using one of several active semiconductor materials (CNTs, semiconducting nanowires or organic semiconductor films) or a combination of them.

Figure 6:
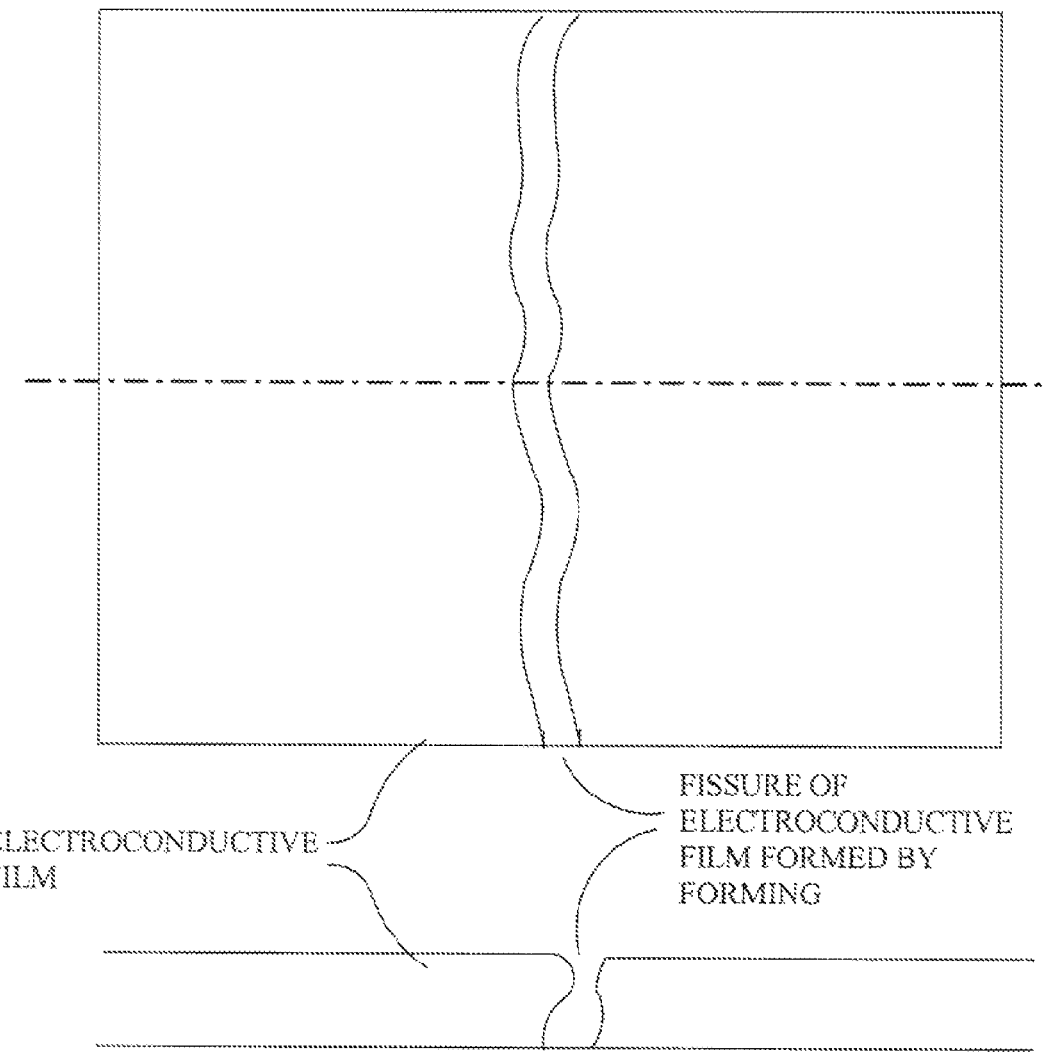
FIG. 6 illustrates depletion of a microcrack structure in reduced PdO film.

The present invention uses a method developed by Canon for SED field emission that employs an ink-jet printed PdO ink to form the source and drain electrodes for the transistor. In this method, a solution (Masahiro Terada et at, "Electron-Emitting Device Having a Fissure," U.S. Pat. No. 6,992,434 and Taiko Motoi et ah, "Electron-Emitting Device . . . ", U.S. Patent Publication 2002/0096986.) of saponified polyvinyl alcohol (degree of saponification: 88%), isopropanol, ethylene glycol and palladium-proline complex (0.10 Pd wt %) is deposited using Inkjet printing, thus bridging the source and drain feedline electrodes. The ink is cured to remove the solvent materials and oxidize the Pd element. This forms a PdO film that is of order 0.1 µm thick or less. By passing pulsed currents through the PdO film in a reducing atmosphere containing hydrogen gas, the PdO film is reduced. This gradually decreases the resistance of the $PdO_x$ film as the oxygen component decreases, but it also induces an internal stress on the him. At some point, the film actually cracks and the resistance across the film increases dramatically. This crack is used in the $PdO_x$ film, which is expected to be 0.1 µm wide or less, as the TFT channel width. The length of the channel will be the width of the PdO printed dot, on the order of 50-100 µm. FIG. 6 is a depiction of the microcrack (fissure) taken from the Canon patents. (See, FIG. 13A of U.S. Pat. No. 6,992,434).

Si nanowires, GaN nanowires and semiconductor-enriched SWNTs are used as the conducting element of the TFT. These materials are deposited using inkjet printing and ac-biased electrophoresis (L. A. Nagahara et ah, "Direct Placement of Suspended CNTs," Appl. Phys. Lett., Vol. 80, p. 3826, 2002). Inkjet printing gives random orientation of the nanowires. Since the channel length is submicron and the length 50-100 µm, it may not be necessary to align the nanowires across the channel. On the other hand, the electrophoresis approach deposits aligned nanowires and carbon nanotubes, allowing improved device performance.

A top gate electrode approach is preferred, as opposed to a bottom gate electrode. In this way the gate structure is not compromised by the microcrack forming technique.

Table 4 compares the properties of 4 different polymer materials that are commonly used for flexible electronics. PEN is chosen as it has a higher glass transition temperature over PET materials and is stronger and has a lower TCE than PEC or PAR materials.

3. Compatible with flexible substrates: The fabrication processes are completely compatible with PEN substrates.

4. Scalable to large area: Ink-jet printers are used now to print billboard signage. 100" diagonal will be no problem. The fact that Canon, is using this microcrack approach for their SED 36" diagonal (and larger) displays also demonstrates that arrays of submicron channel TFTs can be fabricated over large areas reliably.

5. Performance specifications for emissive technologies: The driving currents from this TFT structure are sufficient to drive OLEDs.

The manufacturing process may be divided into tasks:

1) Mask and layout design:

Feedline patterns may be printed using Inkjet printing.

Layer 1: This layer comprises source and drain electrodes 301, feedlines and contact pads and alignment marks for succeeding layers. This layer may be Inkjet printed using Ag conducting ink commercially available and purchased from Cima NanoTech or other sources. Line widths are not less than 100 µm wide.

Layer 2: This is the PdO layer 303. This layer may be also Inkjet printed.

Layer 3: This layer is the semiconducting nanowire layer 306. Two approaches may be used for dispensing this layer. One approach is Inkjet printing. Another approach is to deposit the nanowires using electrophoresis. The Si and GaN semiconducting, nanowires may be purchased from the University of Louisville. The Si and GaN nanowires are provided in an organic solvent as an ink. The concentration may be diluted as needed. The GaN is inert to air at room temperature; the Si nanowires can have a hydrogen termination and thus are relatively inert. (M. K. Sunkara et al., "Bulk. Synthesis of Si Nanowires Using Low-Temperature VLS Method," APL, 79, p. 1546, 2001; B. Li et al., "Direction-Dependent Homoepitaxial Growth of GaN Nanowires," Adv. Mater., 18, p. 216, 2006.) The electrophoresis process may require a photomask.

Layer 4: This layer is the gate dielectric layer 307, May use PMMA (Inkjet printing) and PPSQ (screen printing). Both materials are available commercially (see more discussion below).

TABLE 4

| ITEM | UNIT | PET | PEN | PES | PAR |
|---|---|---|---|---|---|
| Transition temperature | ° | 73-78 | 120 | 220-230 | 325 |
| Density | g/cc | 1.3-1.33 | 1.36 | 1.36-1.58 | 1.21 |
| CTE (−55 to 85° C.) | ppm/° C. | 15 | 13 | 54 | 53 |
| Water Permeability | g/cm² - day | $4 \times 10^{-4}$ | $7 \times 10^{-4}$ | $1 \times 10^{-3}$ | |
| Oxygen Permeability | cc/cm² - day | | $3 \times 10^{-4}$ | $4 \times 10^{-6}$ | |
| Young Modulus | GPa | | 5.3 | 6.1 | 2.2 | 2.9 |
| Tensile Strength | MPa | 225 | 275 | 83 | 100 |
| Refractive index | | | | 1.65 | 1.52 |
| Transmission (400-700 nm) | % | >85 | 85 | 90 | 90 |
| Haze | % | | 25 | | |

PET: Polyester
PEN: Polyethylenenapthalate
PES: Polyesthersulphone
PAR: Polyacrylate Advantages of this approach are:

1. Low cost: All-printing technologies are used to form feedlines and TFT components. Inkjet printing and other printing approaches may be used. Printing is an additive approach and not subtractive, thus in general, the materials cost will be less. In addition, the capital investment for printing equipment is much lower than CVD or vapor deposition equipment needed for a-Si TFT technology or high-performance pentacene transistors.

2. Low temperature; The fabrication processes are below 200° C.

Layer 5: This layer comprises the gate electrode 308 and electrode contact pads.

Materials: Si nanowire materials may be ordered from the University of Louisville. Semiconductor-enriched SWNTs may be obtained from Rice University. Ag inks may be ordered from Cima NanoTech. Photoresist, PMMA, PPSQ and other process chemicals may be ordered from Spectrum or other standard chemical suppliers. The PEN polymer sheet may be purchased from Sigma Aldridge and Shefdahl.

2) Print the feed hues, source and drain electrodes 301 and the PdO layer 303: This is accomplished using Inkjet printing.

This task has several subtasks. The first 3 subtasks are part of the TFT fabrication:

Subtask 2a. Print source and drain electrodes 301 for an array of 10×10 TFT devices using Ag nanomaterial ink from Cima Nanotech. The ink is cured. The highest process temperature may be 200° C. A unique photonic flash process developed by Nanotechnologies, Inc. (K. A. Schroder et al., "Broadcast Photonic Curing of Metallic Nanoparticle Films," NSTI Nanotech 2006, Boston), may be used by purchasing a Photonic Curing System Model PCS 1100 from Nanotechnologies which allows curing of nanomaterial inks on polymer substrates. This avoids high-temperature processing.

Subtask 2b. Prepare PdO ink for deposition using the method described by Canon in their patents (Part ccp4230 from Okuno Pharmaceuticals as documented in Japan Patent Abstract Publication 09-035620.) This is a straight forward solution of saponified polyvinyl alcohol (degree of saponification: 88%), isopropanol, ethylene glycol and palladium-proline complex (0.10 Pd wt %) (Part ecp4230 from Okuno Pharmaceuticals as documented, in Japan Patent Abstract Publication 09-035620.)

Subtask 2c. Inkjet print PdO dots on source and drain electrodes made above. After printing and drying, the parts are cured, again using the photoflash process.

The next 4 subtasks demonstrate that the feedlines may be printed and cured at less than 200° C. without distorting the PEN substrates.

Subtask 2d. Print 32 parallel lines in one direction on 2.5 mm pitch on 5 PEN sheets. Lines may be 100 µm wide and may be 100 mm long and may be Inkjet printed using nano-Ag ink. The ink may be cured. The highest process temperature may be 200° C. Again, one may use the photonic curing process using the PCS 1100 to keep the process temperature low. In addition to the fines, cross marks may be placed in the corners as alignment marks and as a benchmark for measuring shrinkage.

Subtask 2e. Inkjet print PMMA to cover the Ag feedlines. Use a standard curing process that is below 200° C.

Subtask 2f. Repeat Subtask 2d over the PMMA and in the opposite direction. Again one may cure the Ag ink using low temperature and photonic flash to keep the process below 200° C. The photonic flash process will not damage the previous layers.

Subtask 2g. One may test the PEN substrates for stress and shrinkage by looking for warping or curling of the polymer sheet. May test for shrinkage of the polymer sheet by measuring the distance between the alignment marks placed on the substrate and comparing this to the distance of the alignment marks on the glass and also the designed distances.

3) Form the microcrack in the PdO film:

To create a narrow channel, using self-forming techniques. As stated earlier, one may use the technique that was first developed by Canon for SCE field emission applications. This may be accomplished by reducing the PdO layer 303 to Pd metal. During the reduction process, oxygen atoms leave the lattice structure, causing the material to shrink. As the material shrinks, it forces a stress in the film locally, eventually forcing a crack 305 to form across the film. This crack 305 may be the channel for the TFT structure.

The reduction of the PdO may be forced by using electrical pulses across the PdO film 303 while the film is in a reducing gas environment consisting of a partial pressure of hydrogen. Canon has documented (M. Yasuko and Y Masato, Inventors; Japan Patent Abstract Publication 09-035620, published Jul. 2, 1997) that triangular or square wave pulses 0.1 msec long spaced 100 msec apart with increasing voltage to peak values on the order of 10 V are sufficient to reduce the PdO 303 and form, the crack 305. As result for the forming process, not only is a crack 305 formed between source and drain, the $PdO_x$ layer is now sufficiently reduced and conducting such that it is now electrically part of the source and drain electrode 301. Canon has succeeded in performing this process on HDTV screens with a pixel count of 1280×768×3 (about 2.95M pixels) in pilot line production, demonstrating that this is a process that can be carried to production reliably. Furthermore, as part of its hydrogen sensor development, ANI has made practical use of the expansion of Pd upon exposure of Pd to hydrogen gas. Upon, release of the hydrogen, the Pd shrinks, forming nanocracks resulting in resistance changes of the Pd film of several orders of magnitude.

One may use existing electrical test and measurement equipment to apply the electrical pulses. It already has existing equipment that will apply pulses as short at 20 µsec and up to 20 KV (designed and built for field emission applications), far beyond what is required to perform this task. Between the forming pulses, a test pulse may be applied to measure the resistance between source and drain to monitor the process in real time.

4) Deposit the Active Semiconductor Nanowires

After the microcrack channel structure is formed, the next step deposits the active semiconductor layer. The microcrack approach may work with several semiconductor materials, including organic semiconductors such as pentacene, single wall carbon nanotubes (SWNTs), and semiconductor nanowires such as Si, GaN, GaAs, etc. Organic semiconductor material may also work, but the switch voltages would be much higher (3V for Si nanowires, ~30V for pentacene), the conductor mobility would be lower (less than 1 $cm^2$/V-sec), and the device may be more prone, to degradation from humidity or other environmental poisons.

Inks of Si and GaN nanowires may be obtained from the University of Louisville. (M. K. Sunkara et al., "Bulk Synthesis of Si Nanowires Using Low-Temperature VLS Method," APL, 79, p. 1546, 2001; H. Li et al., "Direction-Dependent Homoepitaxial Growth of GaN Nanowires," Adv. Mater., 18, p. 216, 2006.) Depositing them may use two methods. One method prints the nanowire ink using Inkjet printing; this method deposits random alignment of the nanowires. The other method uses electrophoresis to deposit aligned nanowires.

Subtask 4a. Si and GaN nanowires inks may be obtained from the University of Louisville, Since only a dot of the ink material is required at the TFT channel, ANI may use handheld dispensing techniques. The ink consists of the nanowires and a solvent that can evaporate away. A long-chain alcohol such as octanol may be added to the ink so that it does not evaporate too quickly at room temperature. In order to prevent degradation of the nanowires during curing, ANI may evaporate the solvent in a vacuum oven or nitrogen-purged oven.

Subtask 4b. Print each of the semiconductor inks on several devices using inkjet printing. May use existing equipment which has piezoelectric print heads.

Figure 7:
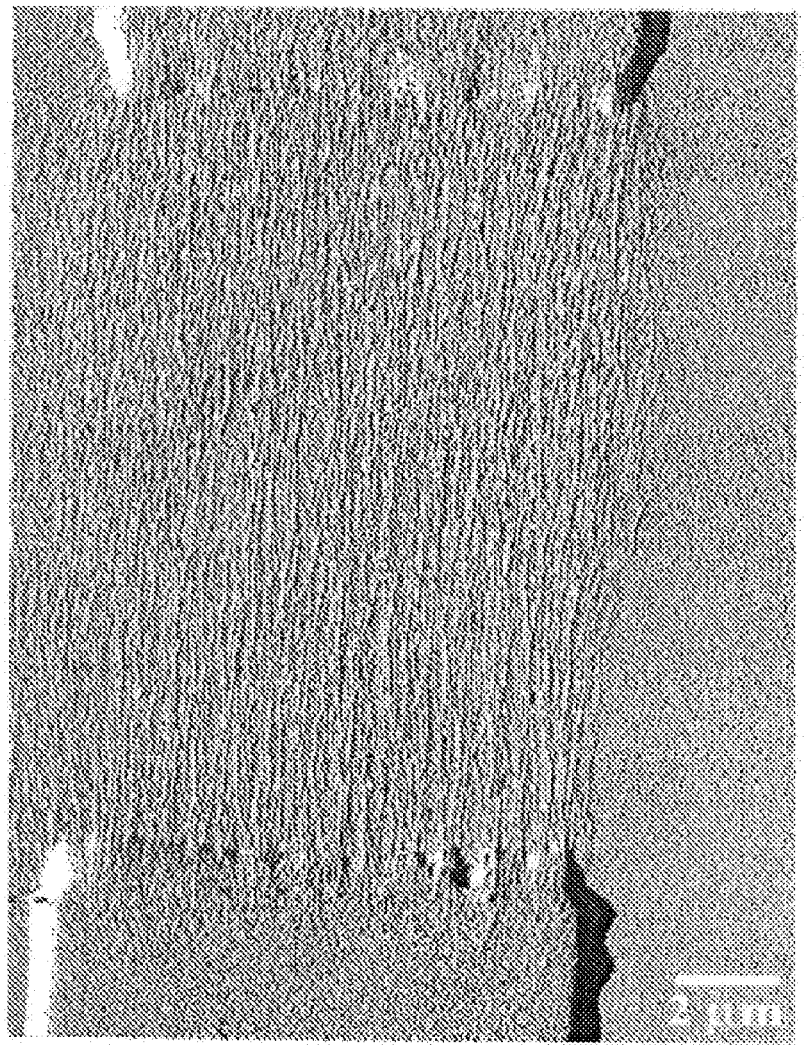
FIG. 7 illustrates an AFM image showing a high degree of direct placement of SWNTs deposited between two electrodes using ac-biased electrophoresis.

Subtask 4c. One may deposit the semiconductors nanotubes and nanowires using ac-biased electrophoresis. Deposition of aligned carbon, nanotubes was demonstrated by researches at Motorola. (L. A. Nagahara et al., "Direct Placement of Suspended CNTs" Appl. Phys. Lett., Vol. 80, p. 3826, 2002.) FIG. 7 shows an AFM image showing the high degree of direct placement of SWNTs deposited between, two electrodes using ac-biased electrophoresis, Nagahara et al. demonstrated this process by simply placing a 50 μL drop of solution over the electrode pair an applying a 5 MHz signal, 0.5-2.5V, for 1-30 seconds. No photoresist pattern was needed. One may photopattern a resist layer to better define the deposition region. One may follow the Motorola process and place a drop of nanowire ink on a single TFT structure that was earlier cut from the larger wafer, make contact to the electrodes and begin to plate a layer of nanowires. One may investigate using different ac signal levels and frequency. One may monitor the resistance across the microcrack channel as a real time measure of the Si nanowire deposition rate.

For both approaches, SEM images may be taken of selected TFT devices after the deposition is completed to document how much material was deposited.

Subtask 4d. One may electrically test some of the devices without a gate and with then with a gate dielectric and gate electrode applied physically by attaching a metal pin or wire that is coated with a dielectric. This may be used as an intermediate test of the devices before moving to (5). Since the gate is not deposited directly onto the device, gate voltages may be higher, but other levels of performance may be measured, such as on-state current levels, that may be close to what would be expected in the final device. At this point, one may also down-select which semiconductor material to use to continue final gate fabrication.

5) Form the gate structure:

Take the devices down-selected in (4) and use them to complete the gate structure. The choice of gate dielectrics is as critical as the choice of the material used for the active semiconductor. Many materials have been used, both inorganic ($SiO_2$, $SiN_x$, $Al_2O_3$, etc.) and organic (poly vinylphenal, polyimide, PMMA, etc.). The review by Jang and Han presents a summary of these materials and contains many references to prior work. They conclude that although inorganic materials have been used, but it is suitable to use organic gate insulators for plastic displays in order to match the thermal expansion coefficients between the substrate and the TFT layers on it. On the other hand, it is well known that polymer materials also trap charges leading to many issues with histeresis.

Figure 8:
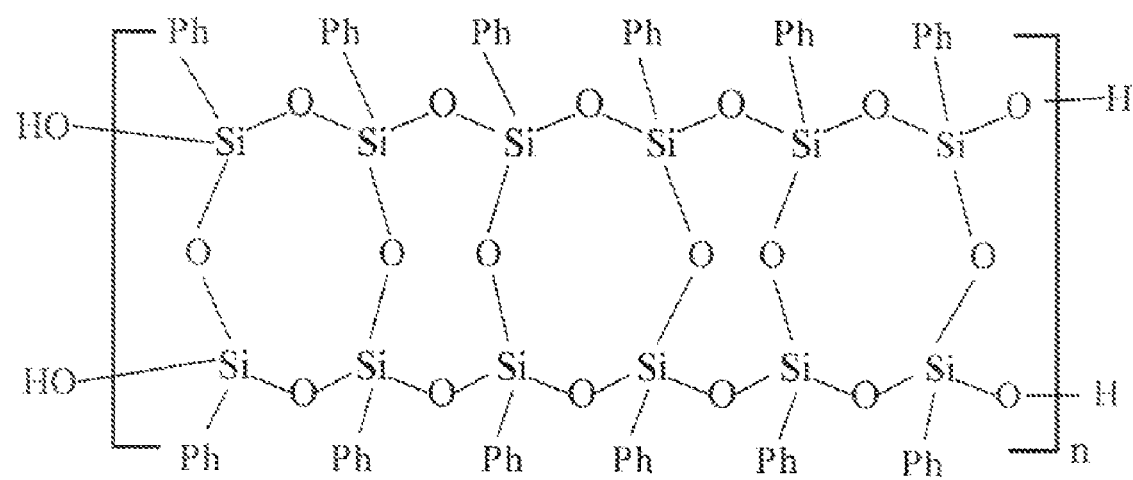
FIG. 8 illustrates a chemical structure of PPSQ.

May use two materials. PMMA, which has been demonstrated as a gate dielectric on polymer substrates (Y. Jin et al., Appl. Phys. Lett., Vol. 85, p. 4406, 2003), and PPSQ (polyphenyl silsesquioxane), a thermally stable, vacuum compatible material featuring siloxane bonds in the main chain attached by phenyl groups. PPSQ is a unique approach in that it is a polymer with a SiO backbone (see FIG. 8). It offers many advantages as a gate dielectric: it can be printed and cured below 200° C., has low shrinkage when annealed and has a high dielectric break-down voltage, and the SiO backbone will help prevent charge trapping. The gate dielectric will be spin-coated. One may use a photoresist layer at the gate dielectric. This can be patterned to form vias in order to make contact to the source and drain electrodes.

Subtask 5a. Inkjet print tire gate dielectric structure using PMMA using the same process as in Task 2. Then cure the PMMA.

Subtask 5b. One may screen print the PPSQ gate dielectric structure using PPSQ.

Subtask 5c. The gate electrode may then be evaporated through, a shadow mask using e-beam evaporation, of Ag metal It is possible to also deposit this layer by Inkjet printing just like the source/drain layer was done in Task 2. One may use the shadow mask evaporation approach in order to get fast turnaround to begin testing the devices as quickly as possible.

The invention claimed is:

1. A thin film transistor (TFT) comprising:
a substrate;
a source electrode on the substrate;
a drain electrode on the substrate positioned a distance from the source electrode;
a layer of metal positioned on the substrate between the source and drain electrodes, wherein the layer of metal includes a microcrack formed in the metal layer between the source and drain electrodes, wherein the microcrack separates a first portion of the metal layer contacting the source electrode from a second portion of the metal layer contacting the drain electrode, wherein the metal layer has a physical configuration having a measurable roughness and oxygen level indicating that the metal layer was formed from a reduction of a metal oxide;
an active semiconductor material deposited so that it bridges the microcrack, contacting both the first and second portions of the metal layer;
a gate dielectric material deposited over the active semiconductor material; and
a gate electrode deposited on the gate dielectric material and not contacting the metal layer or the active semiconductor material.

2. The TFT as recited in claim 1, further comprising a layer of carbon positioned between opposing faces of the microcrack.

3. The TFT as recited in claim 1, wherein the active semiconductor material comprises carbon nanotubes.

4. The TFT as recited in claim 1, wherein the active semiconductor material comprises semiconducting nanowires.

5. The TFT as recited in claim 1, wherein the active semiconductor material comprises organic semiconductors.

6. The TFT as recited in claim 1, wherein the substrate comprises a plastic.

7. The TFT as recited in claim 1, wherein the metal oxide is PdO.

8. The TFT as recited in claim 7, wherein the metal layer is Pd.

9. The TFT as recited in claim 1, wherein the microcrack has a width of less than or equal to 0.1 microns.

10. The TFT as recited in claim 1, wherein the active semiconductor material is in a form of a thin film.

11. A thin film transistor (TFT) comprising:
a plastic substrate;
a source electrode on the plastic substrate;
a drain electrode on the plastic substrate positioned a distance from the source electrode;
a layer of metal oxide deposited on the plastic substrate between the source and drain electrodes, wherein the layer of metal oxide is reduced to metal to form a microcrack in the layer between the source and drain electrodes, wherein the microcrack separates a first portion of the metal layer contacting the source electrode from a second portion of the metal layer contacting the drain electrode, wherein the metal layer has a physical configuration having a measurable roughness and oxygen level indicating that the metal layer was formed from a reduction of the metal oxide;
an active semiconductor material deposited so that it bridges the microcrack, contacting both the first and second portions of the metal layer;
a gate dielectric material deposited over the active semiconductor material; and
a gate electrode deposited on the gate dielectric material and not contacting the metal layer or the active semiconductor material.

12. A thin film transistor (TFT) comprising:
a substrate;
a source electrode on the substrate;
a drain electrode on the substrate positioned a distance from the source electrode;
a layer of palladium oxide deposited on the substrate between the source and drain electrodes, wherein the layer of palladium oxide is reduced to a layer of palladium to form a microcrack in the layer of palladium between the source and drain electrodes, wherein the microcrack separates a first portion of the layer of palladium contacting the source electrode from a second portion of the layer of palladium contacting the drain electrode, wherein the layer of palladium has a physical configuration having a measurable roughness and oxygen level indicating that the layer of palladium was formed from a reduction of the palladium oxide;
an active semiconductor material deposited so that it bridges the microcrack, contacting both the first and second portions of the layer of palladium;
a gate dielectric material deposited over the active semiconductor material; and
a gate electrode deposited on the gate dielectric material and not contacting the layer of palladium or the active semiconductor material.

* * * * *